(12) United States Patent
Sasaki et al.

(10) Patent No.: US 12,713,970 B2
(45) Date of Patent: Aug. 18, 2026

(54) SEMICONDUCTOR DEVICE

(71) Applicant: DENSO CORPORATION, Kariya-city (JP)

(72) Inventors: Yoichi Sasaki, Kariya-city (JP); Satoru Wakiyama, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 439 days.

(21) Appl. No.: 18/472,309

(22) Filed: Sep. 22, 2023

(65) Prior Publication Data

US 2024/0170432 A1 May 23, 2024

(30) Foreign Application Priority Data

Nov. 22, 2022 (JP) ................................ 2022-186526

(51) Int. Cl.
*H10W 74/10* (2026.01)
*H10W 42/00* (2026.01)
*H10W 70/09* (2026.01)
*H10W 70/60* (2026.01)
*H10W 70/652* (2026.01)

(52) U.S. Cl.
CPC .......... *H10W 74/131* (2026.01); *H10W 70/09* (2026.01); *H10W 70/60* (2026.01); *H10W 70/6528* (2026.01)

(58) Field of Classification Search
CPC . H10W 70/09; H10W 70/60; H10W 70/6528; H10W 74/129; H10W 74/019
See application file for complete search history.

(56) References Cited

U.S. PATENT DOCUMENTS 9,653,391 B1 * 5/2017 Yew .................... H10W 90/701
9,679,878 B1 * 6/2017 Lin ....................... H10W 70/09
9,859,233 B1 * 1/2018 Fan ......................... H01L 24/19
10,304,801 B2 5/2019 Huang et al.
10,714,426 B2 7/2020 Hsieh et al.
10,950,577 B2 3/2021 Hsieh et al.
11,742,301 B2 * 8/2023 Agarwal ................ H10P 72/74 257/668
2013/0087914 A1 * 4/2013 Yang .................. H10W 74/127 257/773

(Continued)

FOREIGN PATENT DOCUMENTS

JP 2022-016126 A 1/2022

OTHER PUBLICATIONS

U.S. Appl. No. 18/472,350, filed Sep. 22, 2023, Sasaki et al.

*Primary Examiner* — Mohsen Ahmadi
(74) *Attorney, Agent, or Firm* — Posz Law Group, PLC

(57) ABSTRACT

A semiconductor device includes: a die; a mold material layer in which the die is embedded in a state where an electrode surface of the die is exposed from a surface of the mold material layer; and a redistribution layer provided on a surface of the mold material layer and having an insulating layer and a wiring in a multilayer state, as a fan out wafer level package. The semiconductor device further has a reinforcing structure made of a material harder than the insulating layer, on the insulating layer of the redistribution layer. The reinforcing structure is located between the wiring and a surface of the mold material layer. The reinforcing structure is at a position corresponding to a boundary region between the die and the mold material layer.

5 Claims, 7 Drawing Sheets

(56) References Cited

U.S. PATENT DOCUMENTS

| | | | | |
|---|---|---|---|---|
| 2015/0262931 | A1* | 9/2015 | Vincent | H10W 44/20<br>257/773 |
| 2018/0315674 | A1* | 11/2018 | Chen | H10W 74/117 |
| 2023/0078099 | A1* | 3/2023 | Ecton | H10W 70/611<br>257/773 |
| 2023/0170131 | A1* | 6/2023 | Tang | H01F 27/2804<br>257/531 |
| 2023/0170258 | A1* | 6/2023 | Huang | H10P 54/00<br>257/773 |
| 2023/0291110 | A1* | 9/2023 | Wakiyama | H01Q 1/2283 |
| 2024/0038701 | A1* | 2/2024 | Kuo | H10W 70/614 |
| 2024/0203925 | A1* | 6/2024 | Chiu | H10W 70/635 |

* cited by examiner

P13
P14
P15
P16
P17
9
10
13
13c
14
13, 7
8
7
6
5
4
3
2

51
52
8
B
9
8
9
8
9
9
8
53

SEMICONDUCTOR DEVICE

CROSS REFERENCE TO RELATED APPLICATION

This application is based on Japanese Patent Application No. 2022-186526 filed on Nov. 22, 2022, the disclosure of which is incorporated herein by reference.

TECHNICAL FIELD

The present disclosure relates to a semiconductor device.

BACKGROUND

A fan out wafer level package (FOWLP) technology is used for an electronic device such as a mobile device.

SUMMARY

A semiconductor device includes: a die; a mold material layer in which the die is embedded in a state where an electrode surface of the die is exposed from a surface of the mold material layer; and a redistribution layer provided on a surface of the mold material layer and having an insulating layer and a wiring in a multilayer state, as a fan out wafer level package. The semiconductor device further has a reinforcing structure made of a material harder than the insulating layer, on the insulating layer of the redistribution layer. The reinforcing structure is located between the wiring and a surface of the mold material layer. The reinforcing structure is at a position corresponding to a boundary region between the die and the mold material layer.

DETAILED DESCRIPTION

Figure 1A:
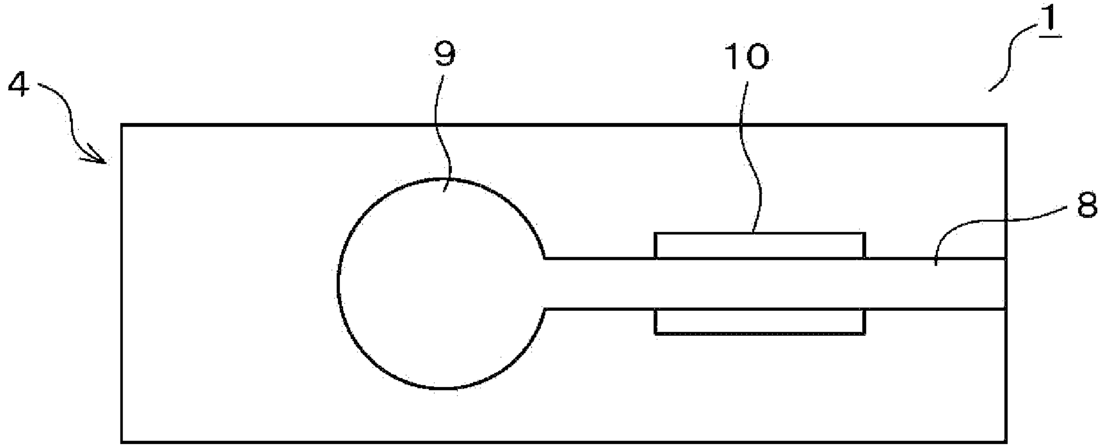
FIG. 1A is a schematic plan view illustrating a semiconductor device according to a first embodiment.

In recent years, a fan out wafer level package (FOWLP) is known as a packaging technology for a semiconductor device such as an IC mounted on an electronic device such as a mobile device. In this type of semiconductor device, a die such as semiconductor chip is sealed with resin material in a state where an electrode surface is exposed from a front surface to form a mold material layer. Further, a redistribution layer having an insulating layer and a wiring in a multilayer state is provided on the die and the mold material layer. Accordingly, it is possible to achieve miniaturization, thinning, and improvement in signal transmission quality.

In the semiconductor package in which the die is sealed with the mold material layer, bending stress is generated in a boundary region between the die and the mold material layer due to a difference in a linear expansion coefficient between the die and the mold material layer when the semiconductor package is subjected to a temperature change during use. A crack may be generated in the wiring of the redistribution layer at the boundary region, which may lead to disconnection. In order to cope with such an issue, a width of the wiring extending across a boundary between the die and the mold material layer is made thicker than that of the other portion to increase strength and improve robustness against disconnection.

However, when the width dimension of the wiring in the redistribution layer is increased, the wiring area in a plan view is increased and the wiring property is deteriorated. It is also considered that the stress acting on the wiring is relaxed by forcibly bending the wiring partially so as to intersect the boundary between the die and the mold material layer in an oblique direction instead of crossing the boundary at a right angle. However, this method also causes an increase in the wiring area in a plan view. Further, since the wiring is irregularly bent, the wiring property deteriorates, which leads to impedance mismatching of the wiring and causes a decrease in the signal quality in the high-speed communication wiring.

The present disclosure provides a semiconductor device, which is a fan out wafer level package, to further improve the robustness against disconnection due to thermal stress in a wiring of a redistribution layer.

A semiconductor device includes: a die; a mold material layer in which the die is embedded in a state where an electrode surface of the die is exposed from a surface of the mold material layer; and a redistribution layer provided on a surface of the mold material layer and having an insulating layer and a wiring in a multilayer state, as a fan out wafer level package. The semiconductor device further has a reinforcing structure made of a material harder than the insulating layer, on the insulating layer of the redistribution layer. The reinforcing structure is located between the wiring and a surface of the mold material layer. The reinforcing structure is at a position corresponding to a boundary region between the die and the mold material layer.

Accordingly, the reinforcing structure is provided on the insulating layer of the redistribution layer so as to be positioned between the wiring and the mold material layer, corresponding to the boundary region between the die and the mold material layer. Since the reinforcing structure is made of a material harder than the insulating layer, the reinforcing structure has higher rigidity than the surrounding portion. Therefore, even when bending stress acts on the boundary region between the die and the mold material layer due to a difference in linear expansion coefficient between the die and the mold material layer when the temperature changes during use, the reinforcing structure can resist the bending stress. Accordingly, it is possible to suppress the transmission of the bending stress to the wiring, and it is possible to suppress the occurrence of cracks and disconnections in the wiring.

Since the reinforcing structure is provided in the thickness direction of the redistribution layer, it is not necessary to increase the width of the wiring or irregularly bend the wiring in a plan view. Therefore, it is possible to suppress an increase in the wiring area as viewed in the surface direction and to secure the wiring property. As a result, in the fan out wafer level package, there is an excellent effect that the robustness of the wiring of the redistribution layer against disconnection due to thermal stress can be further enhanced.

Hereinafter, embodiments will be described with reference to the drawings. The same reference numerals are given to the same portions among the embodiments, and the repetitive description thereof may be omitted. In the drawings, a front surface of a die of a semiconductor device having an electrode is illustrated as an upper surface. In order to make the drawings easy to see, a wiring and the like are shown in a solid line in a plan view, and hatching may be omitted in, for example, an insulating layer in a cross-sectional view.

Figure 1B:
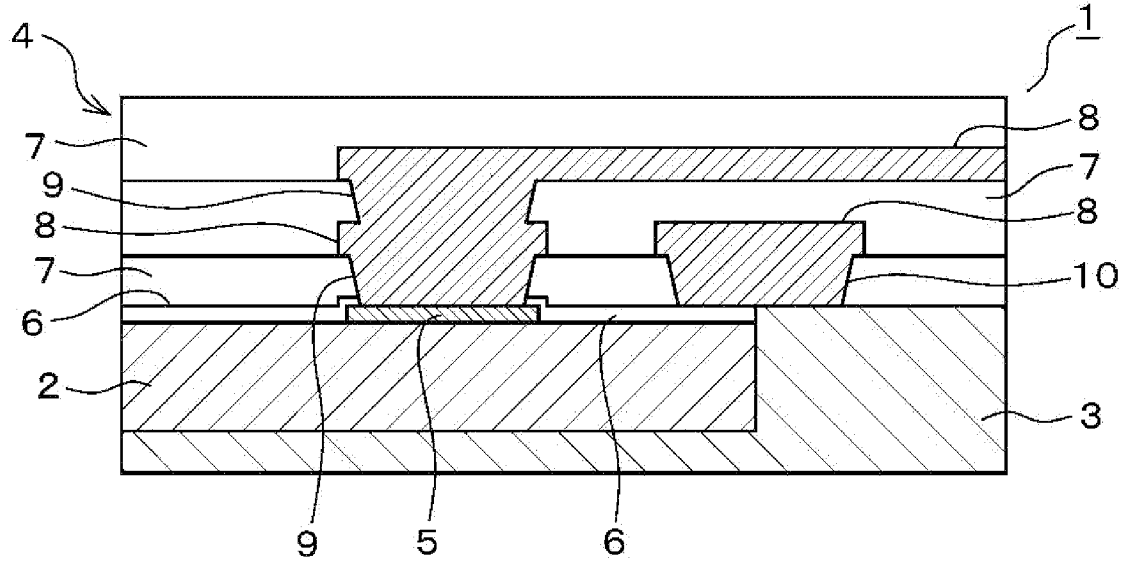
FIG. 1B is a schematic cross-sectional view illustrating the semiconductor device of the first embodiment.
Figure 2:
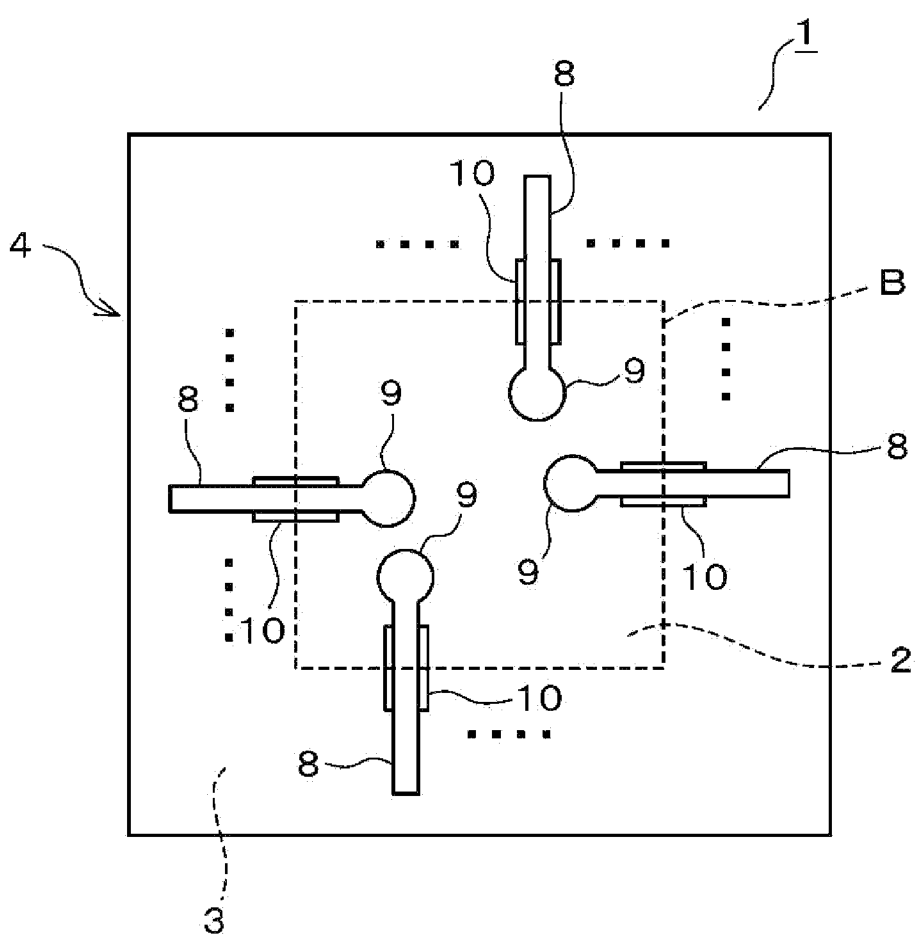
FIG. 2 is a schematic plan view of the semiconductor device.

A first embodiment will be described with reference to FIGS. 1A to 5. FIGS. 1A, 1B and 2 show a configuration of a fan out wafer level package (FOWLP) semiconductor device 1 according to the present embodiment. The semiconductor device 1 includes a die 2 which is a semiconductor chip, a mold material layer 3 and a redistribution layer 4, and has a thin rectangular shape as a whole. The die 2 is embedded in the mold material layer 3 in a state where an electrode is exposed from the surface. The redistribution layer 4 is provided on a surface layer of the die 2 and the mold material layer 3.

As shown in FIG. 2, the die 2 has a quadrangular chip shape, and plural (such as four) electrode pads 5, for example, made of aluminum are provided on the upper surface of the die 2. As shown in FIG. 1B, a surface protective film 6 made of an insulating material is provided so as to expose the electrode pad 5. The mold material layer 3 is made of, for example, a resin material such as an epoxy resin, and is provided so as to cover the lower surface and the side surface of the die 2. The redistribution layer 4 includes an insulating layer 7 and a wiring 8 in a multilayer state. In FIG. 1B, the redistribution layer 4 has three insulating layers 7, e.g., the first layer, the second layer, and the third layer in this order from the bottom, and two wirings 8, e.g., the first layer and the second layer in this order from the bottom.

Each of the insulating layers 7 is made of an insulating material such as polyimide, and one insulating layer 7 has a thickness dimension of, for example, about 7 μm. The wiring 8 is made of, for example, a metal material such as copper, and the thickness dimension of one layer is, for example, about 7 μm. A connection between the wiring 8 (the first layer) and the electrode pad 5 is defined by the via 9. A connection between the wirings 8 is made through the via 9.

In FIG. 1B, the via 9 vertically penetrating the insulating layer 7 (the first layer) is provided on the electrode pad 5 and connected to the wiring 8 (the first layer). The via 9 further vertically penetrating the insulating layer 7 (the second layer) is provided immediately above the via 9 on the wiring 8 (the first layer) and connected to the wiring 8 (the second layer). As shown in FIG. 2, the wiring 8 (the second layer) connected to the via 9 is arranged so as to extend outward (to the right in FIG. 1B) from the electrode pad 5 on the die 2 in a plan view, and intersects perpendicularly with the boundary line B between the die 2 and the mold material layer 3.

In the present embodiment, in the insulating layer 7 of the redistribution layer 4, a reinforcing structure 10 made of a material harder than the insulating layer 7 is located corresponding to the boundary region between the die 2 and the mold material layer 3, below the wiring 8. In the present embodiment, the reinforcing structure 10 is made of the same copper material as that of the wiring 8, and has a thickness corresponding to substantially one layer of the insulating layer 7. The reinforcing structure 10 is formed as a block having a length dimension of, for example, about 20 μm and a width dimension slightly larger than that of the wiring 8 so as to extend over both sides of the boundary line B between the die 2 and the mold material layer 3.

The reinforcing structure 10 is formed as a via connected to the wiring 8 (the first layer), but the reinforcing structure 10 is not electrically connected to the other wiring 8. The lower end of the reinforcing structure 10 is in close contact with the surface protective film 6 of the die 2 and the surface of the mold material layer 3. Further, in the present embodiment, as shown in FIG. 2, the reinforcing structure 10 is provided not entirely along the boundary line B between the die 2 and the mold material layer 3, but only on a part of the wiring 8 arranged so as to straddle the boundary line B. A part of the wiring 8 provided with the reinforcing structure 10 has, for example, a high degree of importance of a signal such as a communication line. The reinforcing structure 10 is not formed in the other wirings such as a power supply and a ground, for example, constructed of plural wirings, which can operate even when one wire is disconnected.

Figure 3:
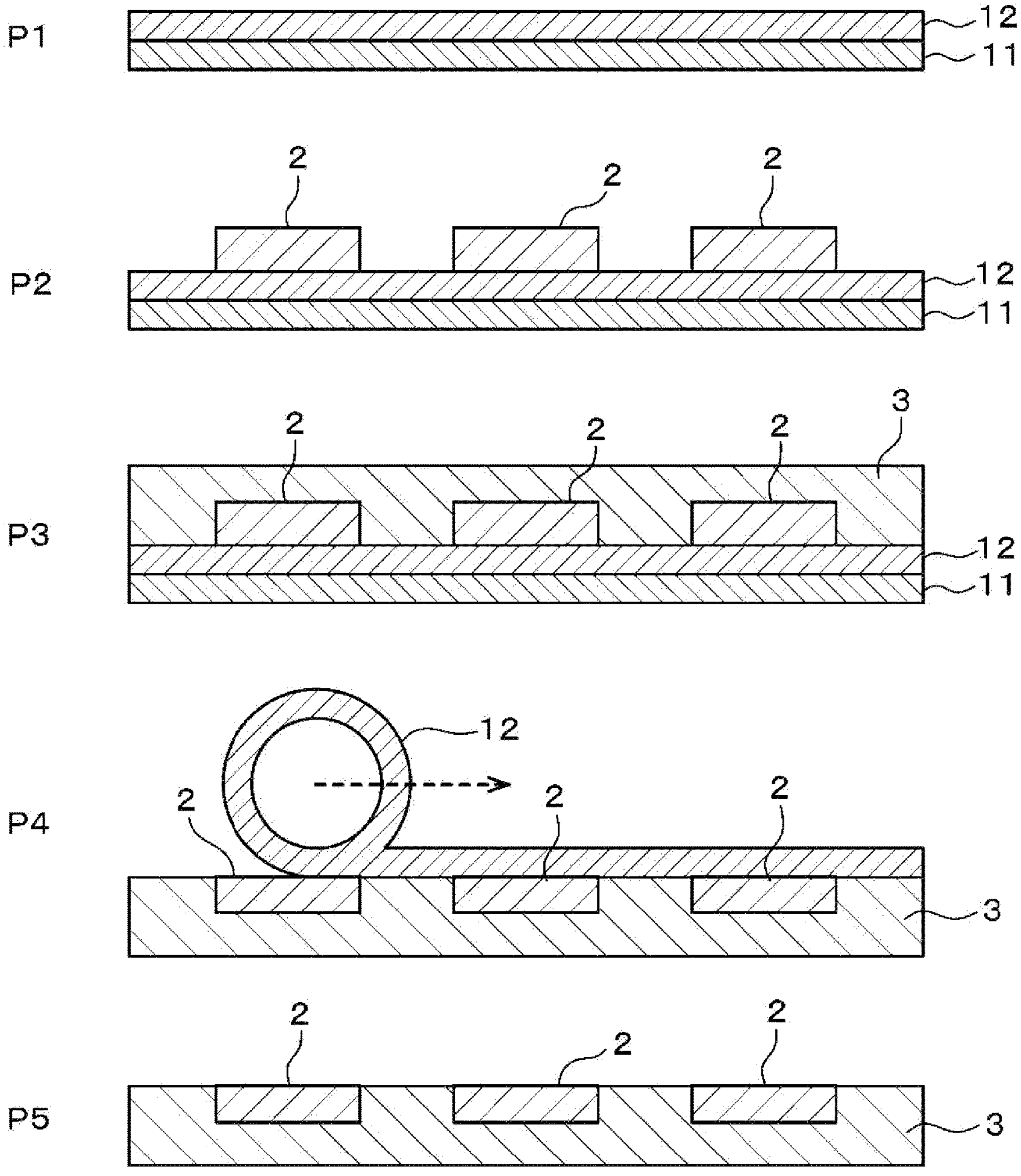
FIG. 3 is a sectional view for explaining a manufacturing process of the semiconductor device.
Figure 4:
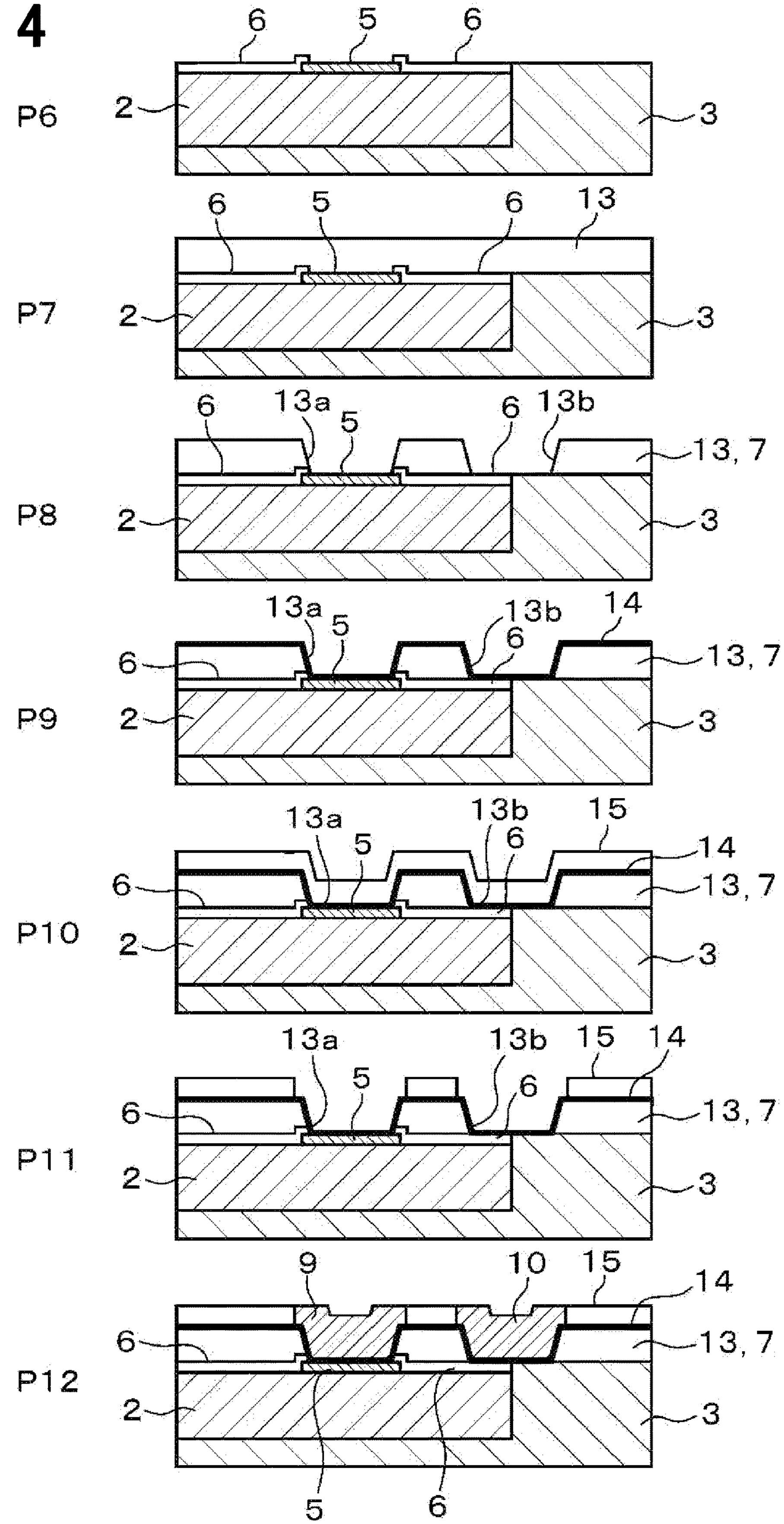
FIG. 4 is a sectional view for explaining a manufacturing process of the semiconductor device.
Figure 5:
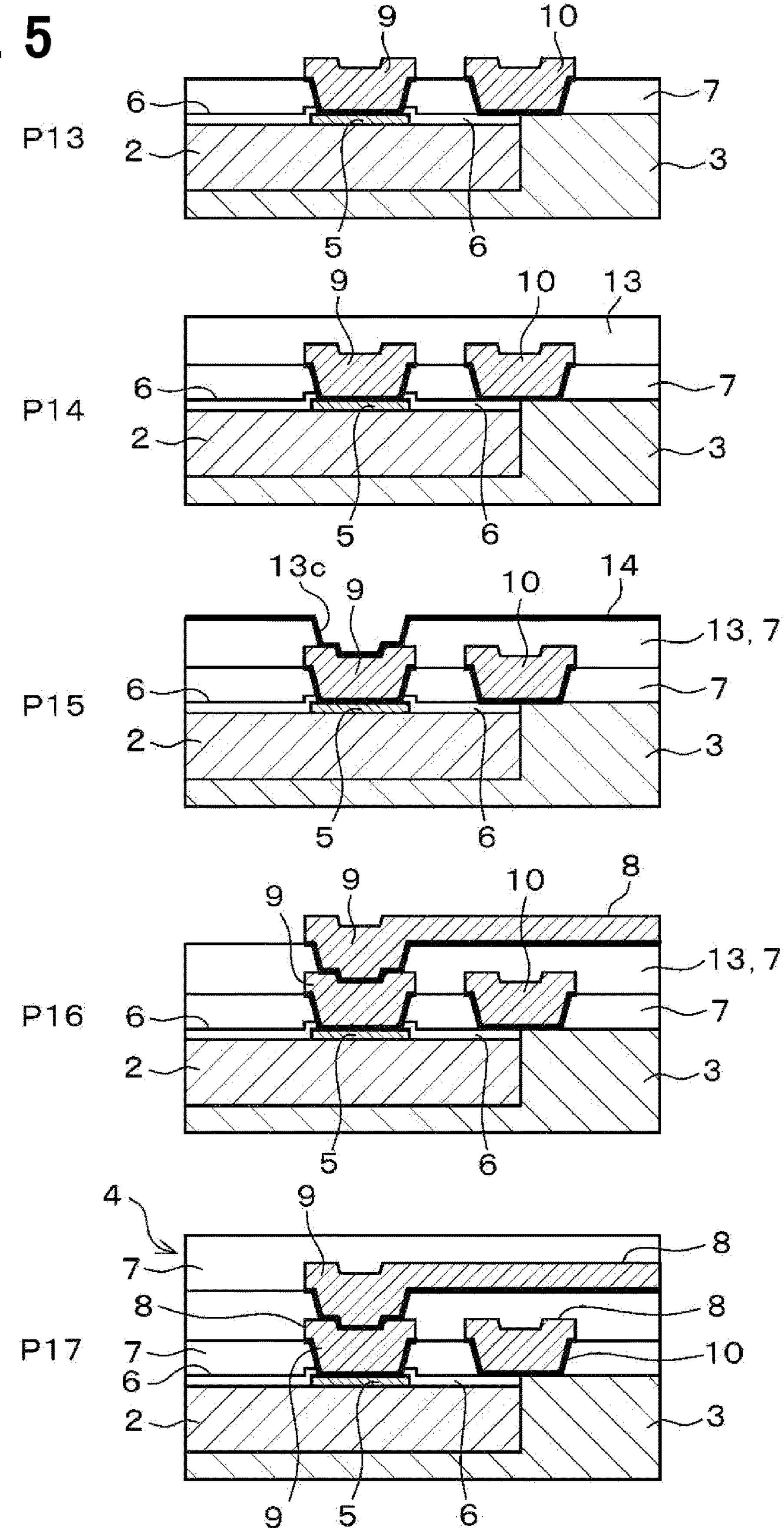
FIG. 5 is a sectional view for explaining a manufacturing process of the semiconductor device.

A manufacturing procedure of the semiconductor device 1 will be briefly described with reference to FIGS. 3 to 5. FIGS. 3 to 5 show the manufacturing process of the semiconductor device 1 in order. FIGS. 3 to 5 are originally a series of drawings, but are divided into three drawings for convenience in terms of space. First, in FIG. 3, process P1 represents preparing a carrier 11 having a temporary bonding film 12 on the upper surface. In process P2, the dies 2 are temporarily bonded to a predetermined position on the temporary bonding film 12 in a vertically inverted state with the electrode surface facing down. Although not shown in FIG. 3, the electrode pad 5 and the surface protective film 6 are provided on each of the dies 2.

In process P3, the carrier 11 to which the die 2 is temporarily bonded is housed in a mold (not shown), and molding with an epoxy resin is performed, such that the mold material layer 3 is formed around the die 2. Thereafter, in process P4, the carrier 11 is debonded, and the temporary bonding film 12 is peeled off from the die 2 and the mold material layer 3. As a result, as shown in process P5, the die 2 is embedded in the mold material layer 3 in a state where the electrode surface of the die 2 is exposed from the front surface of the mold material layer 3. In process P4 and the subsequent processes illustrated by being vertically inverted from process P3, the vertical direction is the same as FIGS. 1A and 1B.

In FIG. 4 illustrating one of the dies 2, at process P6, the die 2 having the electrode pad 5 and the surface protective film 6 is embedded in the mold material layer 3. In process P7, a photosensitive insulating material 13 such as polyimide is applied to the surface of the die 2 and the mold material layer 3. In process P8, a hole 13*a* to be the via 9 and a hole 13*b* to be the reinforcing structure 10 are formed at the upper surface of the electrode pad 5 by a known photolithography method in which the insulating material 13 is exposed to ultraviolet rays with a photomask disposed thereon and is developed to remove unnecessary portions. The insulating layer 7 (the first layer) is formed by curing the insulating material 13.

Thereafter, in process P9, a seed layer 14 made of copper is formed on the surface of the insulating layer 7 (the first layer) and layered along the hole 13*a* and the hole 13*b* by, for example, a sputtering method. In process P10, a photosensitive resist layer 15 is applied to the entire surface of the seed layer 14. Next, in process P11, exposure and development are performed by a photolithography method to remove a part of the resist layer 15 corresponding to the wiring 8 (the first layer), the via 9 and the reinforcing structure 10 to expose the seed layer 14, and the remaining portion of the resist layer 15 is cured.

In process P12, the surface of the seed layer 14 is plated with copper, for example, to form a copper plating layer 16. The copper plating layer 16 serves as the wiring 8 (the first layer), and also serves as the via 9 that connects the electrode pad 5 to the wiring 8, since copper is thickly filled in the hole 13*a*. At the same time, copper is thickly filled in the hole 13*b*, such that the reinforcing structure 10 is formed.

As shown in FIG. 5, in process P13, the resist layer 15 is removed, and the seed layer 14 covered with the resist layer 15 is removed. Thereafter, the same processes as those in processes P7 to P13 are repeated to sequentially form the redistribution layer 4. In process P14, a photosensitive insulating material 13 such as polyimide is applied to the insulating layer 7 (the first layer), the wiring 8 (the first layer), and the upper surface of the via 9.

Next, in process P15, a photomask is disposed on the insulating material 13, so as to form the insulating layer 7 (the second layer) by a known photolithography method, ultraviolet exposure is performed, and development is performed to remove the unnecessary portion. A hole 13*c* to be the via 9 is formed in the insulating material 13 to be the insulating layer 7 (the second layer). The seed layer 14 made of copper is formed on the insulating layer 7 (the second layer) and in the hole 13*c* by, for example, a sputtering method.

Then, in process P16, the photosensitive resist layer 15 is applied to the entire surface of the seed layer 14, and exposure and development are performed by a photolithography method. Thus, a part of the resist layer 15 corresponding to the wiring 8 (the second layer) and the via 9 is removed to expose the seed layer 14, and the surface of the seed layer 14 is plated with, for example, copper. As a result, the wiring 8 (the second layer) is formed, and at the same time, the via 9 is formed so as to be connected to the wiring 8 (the second layer), since copper is thickly filled in the hole 13*c*. Thereafter, the resist layer 15 is removed, and the seed layer 14 covered with the resist layer 15 is removed.

Thereafter, in process P17, a photosensitive insulating material 13 such as polyimide is applied to the insulating layer 7 (the second layer), the wiring 8 (the second layer), and the upper surface of the via 9, such that the insulating layer 7 (the third layer) is formed. Thus, the reinforcing structure 10 embedded in the insulating layer 7 is formed in the redistribution layer 4 together with the wiring 8 and the via 9. At this time, during the process of forming the redistribution layer 4, the reinforcing structure 10 can be formed simultaneously with the formation of the wiring 8 and the via 9 by the same process as the formation of the via 9. Note that plural semiconductor devices 1 are simultaneously formed in a form of being connected with each other by the mold material layer 3, and then singulation is performed.

Effects of the semiconductor device 1 of the present embodiment will be described. In the semiconductor device 1, for example, when the temperature changes in a use environment, bending stress is generated due to a difference in linear expansion coefficient between the die 2 made of silicon and the mold material layer 3 made of epoxy resin. The bending stress acts on a boundary region between the die 2 and the mold material layer 3, adjacent to the boundary line B of the wiring 8 of the redistribution layer 4. There is a possibility that a crack occurs in the wiring 8.

However, in the present embodiment, the reinforcing structure 10 made of copper, which is a harder material than the insulating layer 7 made of resin, is provided in the redistribution layer 4 on the wiring 8 corresponding to the boundary region between the die 2 and the mold material layer 3. Since the reinforcing structure 10 has higher rigidity than the surrounding portion, the reinforcing structure 10 can resist the bending stress which acts on the boundary region between the die 2 and the mold material layer 3. Accordingly, it is possible to suppress the transmission of the bending stress to the wiring 8, and it is possible to suppress the occurrence of cracking or disconnection of the wiring 8.

Since the reinforcing structure 10 is provided as embedded in the insulating layer 7, it is possible to eliminate the need to increase the width of the wiring 8 or to irregularly bend the wiring 8 in a plan view. Therefore, it is possible to suppress an increase in the wiring area as viewed in the surface direction and to secure the wiring property. As a result, according to the present embodiment, in the semiconductor device 1, the robustness against the disconnection caused by thermal stress can be further enhanced for the wiring 8 of the redistribution layer 4.

In the present embodiment, the reinforcing structure 10 is formed simultaneously with the formation of the via 9 by using the process of forming the via 9 in the redistribution layer 4. This makes it possible to easily form the reinforcing structure 10 in the step of forming the redistribution layer 4 without requiring a special method or step or another material.

The reinforcing portion 10 is provided, for example, on a communication line, which is a part of the wiring 8 having a high signal transmission speed, while the wiring 8 is arranged so as to straddle the boundary region between the die 2 and the mold material layer 3 in the redistribution layer 4. Accordingly, the reinforcing structure 10 is selectively provided in a necessary portion of the wiring 8, and thus it is possible to minimize the overhead of the wiring region in the redistribution layer 4.

Figure 6:
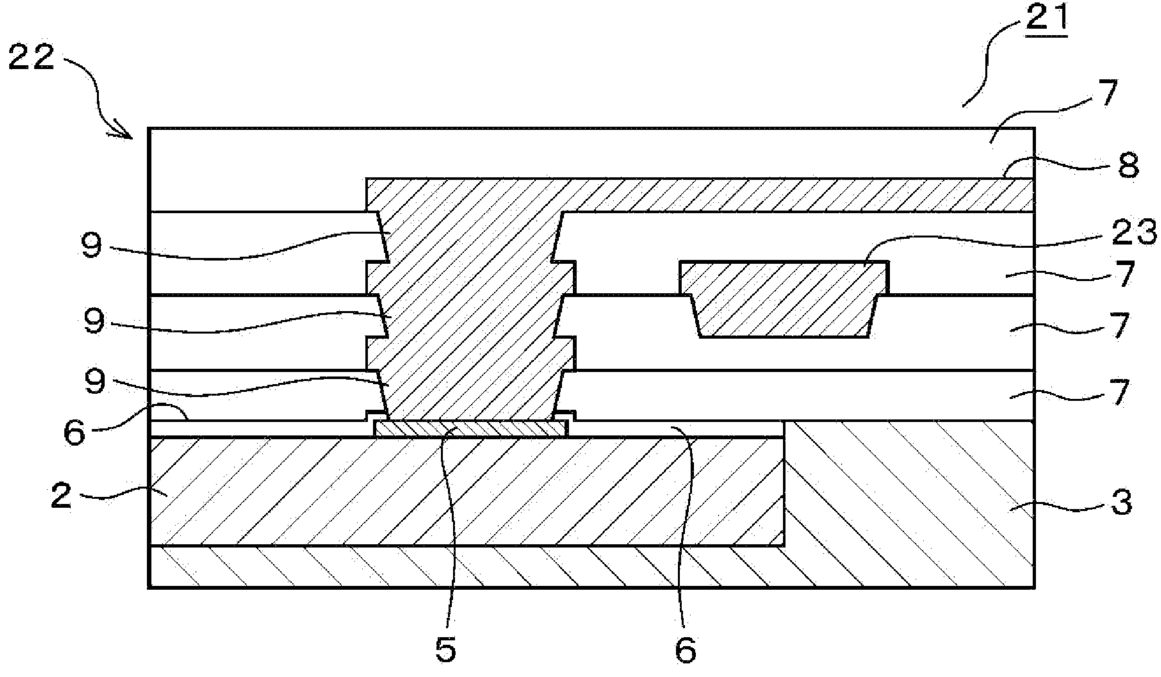
FIG. 6 is a schematic cross-sectional view illustrating a semiconductor device according to a second embodiment.

FIG. 6 shows a sectional view illustrating a semiconductor device 21 according to a second embodiment. The semiconductor device 21 is a fan out wafer level package, and includes the die 2, the mold material layer 3 in which the die 2 is embedded, and the redistribution layer 22 provided on the die 2 and the mold material layer 3. The redistribution layer 22 includes the insulating layer 7 and the wiring 8 in a multilayer state.

The redistribution layer 22 includes four insulating layers 7 and three wirings 8. The via 9 vertically penetrating the insulating layer 7 (the first layer) is provided on the electrode pad 5 and connected to the wiring 8 (the first layer). The via 9 further vertically penetrating the insulating layer 7 (the second layer) is provided immediately above the via 9 on the wiring 8 (the first layer) and connected to the wiring 8 (the second layer). Further, the via 9 vertically penetrating the insulating layer 7 (the third layer) is provided directly above the via 9 on the wiring 8 (the second layer), and is connected to the wiring 8 (the third layer). The wiring 8 (the third layer) connected to the via 9 is arranged so as to extend outward (rightward in FIG. 6) and intersects the boundary line B between the die 2 and the mold material layer 3 at a right angle.

In the present embodiment, the reinforcing structure 23 made of a material harder than the insulating layer 7 is provided in the redistribution layer 22, corresponding to the boundary region between the die 2 and the mold material layer 3. The reinforcing structure 23 is located below the wiring 8 and above the die 2 and the mold material layer 3. The reinforcing structure 23 is formed of the same copper material as the wiring 8 and has a thickness of substantially one layer of the insulating layer 7 (the second layer) so as to vertically penetrate the insulating layer 7. The reinforcing structure 23 is provided at a position separated from the mold material layer 3 and the surface protective film 6, in the redistribution layer 22, via the insulating layer 7 (the first layer).

The reinforcing structure 23 is configured by the via provided in the redistribution layer 22. Although a detailed description is omitted, the formation of the redistribution layer 22 is performed by the same process as described in the first embodiment. A hole to be the via 9 and a hole to be the reinforcing structure 23 are formed in the insulating layer 7 (the second layer). At the same time as the wiring 8 (the second layer) is formed, copper is filled in the holes, thereby forming the reinforcing structure 23 together with the via 9.

In the semiconductor device 21, the reinforcing structure 23 made of copper, which is a harder material than the insulating layer 7 made of resin, is provided in the redistribution layer 22 on a part of the wiring 8 corresponding to the boundary region between the die 2 and the mold material layer 3. As a result, according to the second embodiment, similarly to the first embodiment, the robustness against the disconnection caused by thermal stress of the wiring 8 of the redistribution layer 22 can be further enhanced in the semiconductor device 21. Further, the reinforcing structure 23 can be easily formed by using the process of forming the via 9 in the redistribution layer 22.

Further, in the present embodiment, the reinforcing structure 23 is provided at a position separated from the surface of the mold material layer 3 and the surface protective film 6 through the insulating layer 7 in the redistribution layer 22. Accordingly, even if the adhesiveness between the copper material of the reinforcing structure 23 and the surface of the mold material layer 3 is low, the reinforcing structure 23 can be located between the wiring 8 and the mold material layer 3 and floated in the insulating layer 7. At this time, similarly to the wirings 8 and the vias 9, since the reinforcing structure 23 is made of a material having relatively good adhesiveness to the insulating layer 7, it is possible to restrict defects such as peeling due to low adhesive strength between the reinforcing structure 23 and the mold material layer 3.

Figure 7:
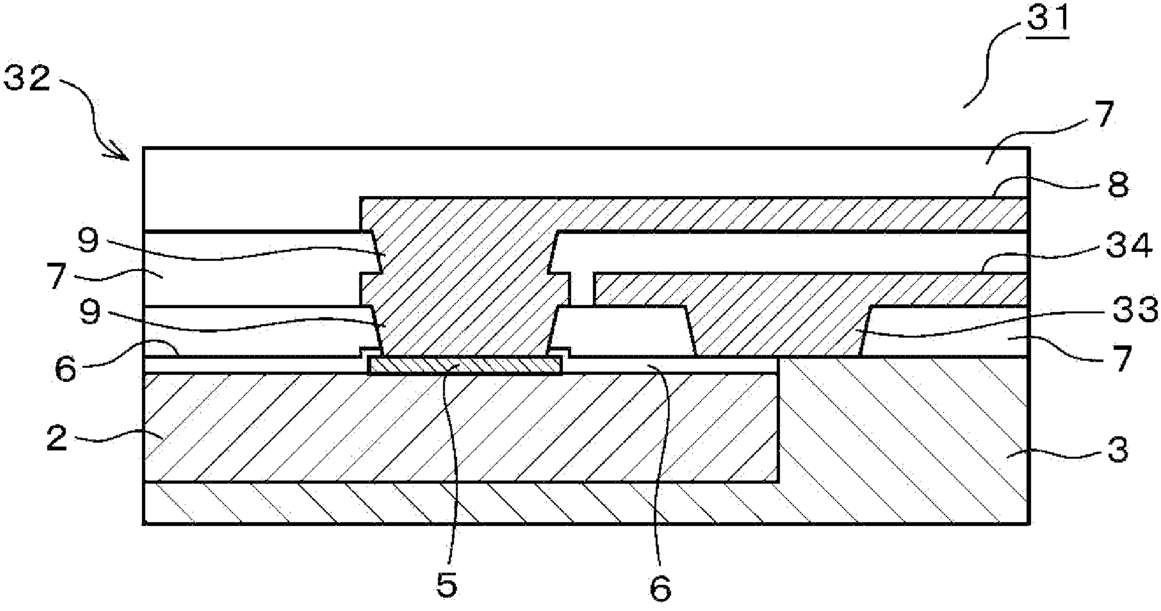
FIG. 7 is a schematic cross-sectional view illustrating a semiconductor device according to a third embodiment.

FIG. 7 shows a sectional configuration illustrating a semiconductor device 31 according to a third embodiment. In the third embodiment, the configuration of the reinforcing structure 33 provided in the redistribution layer 32 is different from those in the first and second embodiments. The semiconductor device 31 is a fan out wafer level package, and includes the die 2, the mold material layer 3 in which the die 2 is embedded, and the redistribution layer 32 provided on the die 2 and the mold material layer 3. The redistribution layer 32 includes the insulating layer 7 and the wiring 8 in a multilayer state.

In the present embodiment, a ground plane 34 for noise countermeasure is provided in the same layer as the wiring 8 (the first layer) between the first layer and the second layer of the insulating layer 7 of the redistribution layer 32. The ground plane 34 is formed simultaneously with the wiring 8 (the first layer). The reinforcing structure 33 is projected downward from the ground plane 34 corresponding to a boundary region between the die 2 and the mold material layer 3 such that the wiring 8 is increased in thickness. The reinforcing structure 33 is configured by the via provided integrally with the ground plane 34 in the redistribution layer 32.

Similarly to the first embodiment, in the process of manufacturing the redistribution layer 32, a hole to be the reinforcing structure 33 is formed when a hole to be the via 9 is formed in the insulating layer 7 (the first layer) at the upper surface of the electrode pad 5. The via 9 and the wiring 8 (the first layer) are integrally provided by plating copper on the surface of the insulating layer 7 (the first layer) and in the hole. The reinforcing structure 33 and the ground plane 34 are integrally provided by plating copper on the surface of the insulating layer 7 (the first layer) and in the hole.

In the semiconductor device 31 of the third embodiment, similarly to the first and second embodiments, due to the reinforcing structure 33, it is possible to obtain an excellent effect that the robustness against disconnection due to thermal stress of the wiring 8 of the redistribution layer 32 can be further enhanced. Also in the present embodiment, the reinforcing structure 33 can be easily formed by using the process of forming the via 9 in the redistribution layer 32.

According to the present embodiment, using the ground plane 34 provided for noise suppression, the reinforcing structure 33 can be configured by partially increasing the thickness of the ground plane 34 corresponding to the boundary region of the wiring 8 between the die 2 and the mold material layer 3. Accordingly, the wiring region of the redistribution layer 32 can be effectively used, and it is not necessary to increase the number of layers of the redistribution layer 32 in order to provide the reinforcing structure 33. The reinforcing structure 33 can be easily formed.

Figures 8, 9:
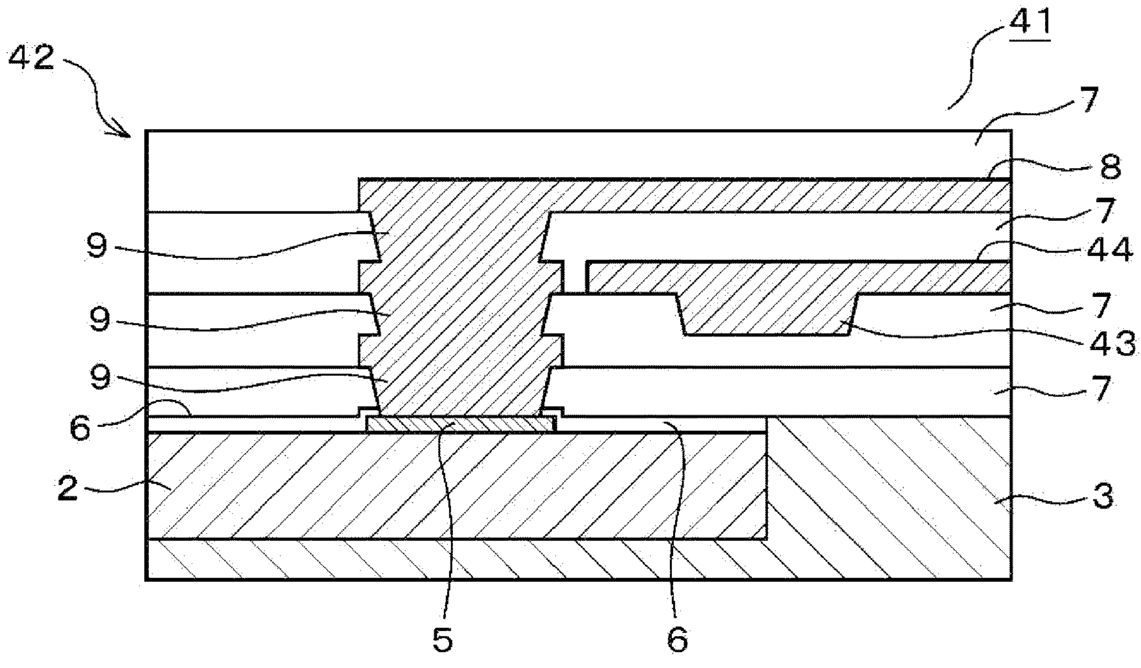
FIG. 8 is a schematic cross-sectional view illustrating a semiconductor device according to a fourth embodiment.
FIG. 9 is a schematic plan view illustrating a semiconductor device according to a fifth embodiment.

FIG. 8 shows a sectional configuration illustrating a semiconductor device 41 according to a fourth embodiment. In the fourth embodiment, the configuration of the reinforcing structure 43 provided in the redistribution layer 42 is different from that in the third embodiment. The semiconductor device 41 is a fan out wafer level package, and includes the die 2, the mold material layer 3 in which the die 2 is embedded, and the redistribution layer 42 provided on the die 2 and the mold material layer 3. The redistribution layer 42 includes the insulating layer 7 and the wiring 8 in a multilayer state.

In the present embodiment, the ground plane 44 for noise countermeasure is provided in the same layer as the wiring 8 (the second layer) and located between the second layer and the third layer of the insulating layer 7 of the redistribution layer 42. The ground plane 44 is formed simultaneously with the wiring 8 (the second layer). In addition, the reinforcing structure 43 is projected downward from the ground plane 44 corresponding to the boundary region between the die 2 and the mold material layer 3. The reinforcing structure 43 is configured by the via integrally provided in the ground plane 44 in the redistribution layer 42, and is provided at a position separated from the surface of the mold material layer 3 and the surface protective film 6 via the insulating layer 7. The reinforcing structure 43 and the ground plane 44 are formed in the same manner as in each of the embodiments.

Due to the reinforcing structure 43 provided in the semiconductor device 41, it is possible to obtain an excellent effect that the robustness of the wiring 8 of the redistribution layer 42 against disconnection due to thermal stress can be further enhanced. In this case, since the reinforcing structure 43 is configured using the ground plane 44, it is possible to effectively use the wiring region of the redistribution layer 42, and it is not necessary to increase the number of layers of the redistribution layer 42 in order to provide the reinforcing structure 43. The reinforcing structure 43 can be easily formed. It is possible to restrict defects such as peeling due to low adhesive strength between the reinforcing structure 43 and the mold material layer 3.

FIG. 9 shows a planar configuration of a semiconductor device 51 according to a fifth embodiment. The semiconductor device 51 of the fifth embodiment is a fan out wafer level package, and includes the die 2, the mold material layer 3 in which the die 2 is embedded, and the redistribution layer 52 provided on the die 2 and the mold material layer 3. The redistribution layer 52 is configured by providing the insulating layer 7 and the wiring 8 in a multilayer state.

In the insulating layer 7 of the redistribution layer 52, the reinforcing structure 53 made of a material harder than the insulating layer 7 is provided between the wiring 8 corresponding to the boundary region between the die 2 and the mold material layer 3 and the surface of the mold material layer 3. The reinforcing structure 53 is not provided for each of the wirings 8, but is provided in a rectangular frame shape surrounding the entire circumference of the die 2 along the boundary region between the die 2 and the mold material layer 3. The reinforcing structure 53 can be formed as the via provided in the redistribution layer 52.

In the semiconductor device 51 of the fifth embodiment, due to the reinforcing structure 53, it is possible to obtain an excellent effect that the robustness against disconnection due to thermal stress of the wiring 8 of the redistribution layer 52 can be further enhanced.

In each of the embodiments, the reinforcing structure is provided so as to straddle both sides of the boundary line B in the area corresponding to the boundary region between the die 2 and the mold material layer 3. However, the reinforcing structure may be provided so as to be positioned adjacent to the die 2 or the mold material layer 3, while it is possible to be resist against warpage deformation caused by heat. In addition, the process for forming the reinforcing structure is not limited to the above-described process, and various modifications are possible. In addition, the material of each part constituting the semiconductor device, the specific numerical values such as total number of layers in the redistribution layer, the thickness dimension, and the length and thickness dimension of the reinforcing structure are merely examples and can be appropriately changed.

The present disclosure has been described based on the embodiments, but it is understood that the present disclosure is not limited to the embodiments or structures. To the contrary, the present disclosure is intended to cover various modification and equivalent arrangements. In addition, various combinations and modes, and other combinations and modes including only one element, more elements, or less elements are also within the scope and idea of the present disclosure.

What is claimed is:

1. A semiconductor device comprising:

a die;

a mold material layer in which the die is embedded in a state where an electrode surface of the die is exposed from a surface of the mold material layer; and a redistribution layer provided on a surface of the mold material layer and having an insulating layer and a wiring in a multilayer state, as a fan out wafer level package, wherein the semiconductor device further has a reinforcing structure made of a material harder than the insulating layer, on the insulating layer of the redistribution layer, the reinforcing structure is located between the wiring and a surface of the mold material layer, and the reinforcing structure is positioned to be aligned with a boundary line, wherein the boundary line is between the die and the mold material layer, wherein the reinforcing structure is formed by partially increasing a thickness of the wiring, wherein the redistribution layer includes a ground plane for noise suppression, the reinforcing structure is made of the ground plane whose thickness is partially increased at a position corresponding to a boundary region of the wiring between the die and the mold material layer, and a surface of the reinforcing structure opposite to the wiring is not electrically connected with another wiring.

2. The semiconductor device according to claim 1, wherein the reinforcing structure has a via inside the redistribution layer.

3. The semiconductor device according to claim 1, wherein the reinforcing structure is located at a position separated from a surface of the mold material layer via an insulating layer in the redistribution layer.

4. The semiconductor device according to claim 1, wherein the reinforcing structure is provided at a part of the wiring arranged in the redistribution layer so as to intersect the boundary line between the die and the mold material layer.

5. The semiconductor device according to claim 1, wherein the reinforcing structure is provided not entirely along the boundary line but only on a part of the wiring arranged to straddle the boundary line.

* * * * *